United States Patent [19]

Takigawa et al.

[11] Patent Number: 4,804,940

[45] Date of Patent: Feb. 14, 1989

[54] RESISTOR AND ELECTRON DEVICE EMPLOYING THE SAME

[75] Inventors: Akira Takigawa; Shizuo Kondo; Masumi Kasahara; Toshinori Hirashima; Mikio Haijima; Setsuo Ogura, all of Takasaki; Osamu Takada, Ohta; Yoshiki Akamatsu, Takasaki, all of Japan

[73] Assignees: Hitachi, Ltd.; Hitachi Microcomputer Eng., both of Tokyo, Japan

[21] Appl. No.: 843,666

[22] Filed: Mar. 25, 1986

[30] Foreign Application Priority Data

Mar. 25, 1985 [JP] Japan .................................. 60-58415
Jun. 14, 1985 [JP] Japan ................................ 60-128208

[51] Int. Cl.⁴ ........................ H03M 1/36; H03M 1/74
[52] U.S. Cl. ....................................... 341/133; 174/1;
338/287; 338/283; 338/320; 338/333; 341/154; 341/159
[58] Field of Search ........ 338/292, 293, 333, 307–309, 338/314, 287, 320, 283; 340/347 AD, 347 SH, 347 M; 174/1

[56] References Cited

U.S. PATENT DOCUMENTS

| | | | |
|---|---|---|---|
| 2,775,754 | 12/1956 | Sink | 340/347 DA |
| 3,134,912 | 5/1964 | Evans | 307/304 X |
| 3,359,467 | 12/1967 | Cook, Jr. | 29/620 X |
| 3,803,708 | 4/1974 | Wada et al. | 338/333 X |
| 4,146,882 | 3/1979 | Hoff, Jr. et al. | 340/347 DA |
| 4,150,366 | 4/1979 | Price | 340/347 DA X |
| 4,276,543 | 6/1981 | Miller et al. | 340/347 AD |

OTHER PUBLICATIONS

European Search Report, Toute L'Electronique, No. 424, Aug./Sep., 1977 & English Trans.
The Marconi Review, vol. 42, No. 215, 4th Quarter 1979.

Primary Examiner—T. J. Sloyan
Attorney, Agent, or Firm—Antonelli, Terry & Wands

[57] ABSTRACT

A resistor is provided with a plurality of turn parts whose corners have an obtuse flexional angle in order to improve the relative resistance precision. A ladder resistor can be formed with a plurality of such resistors connected in series, and various electronic devices are formed employing the ladder resistor.

16 Claims, 7 Drawing Sheets

RESISTOR AND ELECTRON DEVICE EMPLOYING THE SAME

BACKGROUND OF THE INVENTION

The present invention relates to an electrical resistor and an electronic device employing it, and more particularly to techniques which are effective when applied to a thin-film resistor and a high-precision digital-to-analog (D/A) converter or analog-to-digital (A/D) converter employing it.

When it is intended to form a large number of resistors having a desired resistance value within a limited space as in a semiconductor wafer, the resistors can be put into a curved shape on account of the limited layout space.

The inventors' study has revealed that in such a curved shape the curved parts of the resistors are difficult to form accurately, and serve to lower the relative precision of the resistance values of the individual resistors.

The present invention has been made in quest of providing, in an electronic device, such as a semiconductor device, a large number of resistors which are especially characterized by a high relative precision of resistance values.

SUMMARY OF THE INVENTION

Typical aspects of performance of the present invention will be summarized below.

Features of a Single Resistor

A single resistor of the present invention is shown in FIG. 2(a).

(1) The flexional angle of each of the turn parts ($a_1$–$a_8$) of the resistor is set at an obtuse angle, for example, 135 degrees.

(2) More preferably, the resistor is so shaped as to bend alternately bilaterally with respect to a phantom center line such as that shown extending vertically in FIG. 2(a). That is, the resistor is so shaped as to have a first bent portion X (hatched in FIG. 2(a)) which lies on the right side of a plane bisected with the center line as a boundary and a second bent portion Y which lies on the left side.

(3) More preferably, the number, flexional angle and shape of the turn parts ($a_3$, $a_4$, $a_7$, $a_8$) in the first bent portion X are made the same as those of the turn parts ($a_1$, $a_2$, $a_5$, $a_6$) in the second bent portion Y.

(4) More preferably, the shape of a polygon enclosed with the outer edge of the first bent portion X and the phantom center line is made congruent or similar to the shape of a polygon enclosed with the outer edge of the second bent portion Y and the phantom center line.

These produce effects as follows.

Owing to feature (1), the deviation of a resistance value attributed to processing errors in forming the resistor can be reduced. The reason is that the precision of etching processing is higher in the case of forming an obtuse angle than in a case where the flexional angle is a right angle or an acute angle.

Owing to feature (2), deviations within a semiconductor wafer, for example, a deviation ascribable to evaporation in the case of forming thin-film resistors, can be reduced. More specifically, in depositing aluminum or the like on the wafer by the use of vacuum evaporation, there might arise a tendency in which an evaporated thickness increases from the left toward the right of the wafer, by way of example. Even in such a case, the changes of resistance values due to the deviation of the evaporated thickness are cancelled by the right and left bent portions which are alternately bent bilaterally with respect to the phantom center line.

Owing to features (3) and (4), the deviation between the right and left portions with the phantom center line as the boundary is more effectively cancelled, and the deviation of the resistance value of the resistor can be minimized.

Features of a Series Resistor (Ladder Resistor) with the Above Resistor Connected in Series In forming a series resistor in a limited space, the series resistor will generally have a folded-back portion at areas where the series resistor is bent from a rectilinear portion and a non-folded-back portion (see FIG. 4).

In the non-folded-back portion, the resistors as described in features (1)–(4) are connected in series and used, whereby the relative precision of the resistance values of the individual resistors is sharply enhanced as compared with that in a prior art.

In a folded-back portion, a resistor whose turn parts have the same shape as that of the turn parts of the resistor described in features (1)–(4) is used, thereby to prevent disorders of the relative precision in this folded-back portion (e.g. see FIGS. 5 and 6).

Another example of the folded-back portion has an arrangement in which rectilinear resistors are connected in parallel (e. g. see FIG. 7). In this case, the absolute deviation of a resistance value is diminished in correspondence with the parallel connection, with the result that disorders of the relative precision in the folded-back portion can be prevented.

When an electronic device such as an A/D converter or a D/A converter is constructed by the use of the above series resistor, the conversion precision thereof can be enhanced to achieve an enhanced performance.

DESCRIPTION OF THE PREFERRED EMBODIMENTS

Matters Studied by the Inventors Before the Present Invention

As compared with a diffused layer resistor, etc., a thin-film resistor made of a metallic resistor of aluminum or the like has the advantage that a resistance value of high precision can be attained reproducibly. Accordingly, such resistors find particular use in places requiring high precision resistance in a semiconductor integrated circuit device.

In, for example, a parallel type A/D converter, a common analog input voltage is applied to one input of each of a large number of voltage comparators, while reference voltages differing stepwise are respectively applied to the other inputs of the large number of voltage comparators, and a digital output corresponding to the input voltage is derived from the comparison output sides of the respective voltage comparators. To this end, a ladder resistor is required in which a large number of resistors of high relative precision are connected together. This ladder resistor is formed by connecting the aforementioned thin-film resistors in large numbers.

Figure 1A:
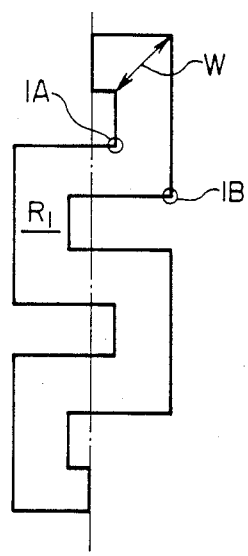
FIG. 1(a) shows the plane shape of a thin-film resistor which was studied by the inventors before the present invention.
Figure 1B:
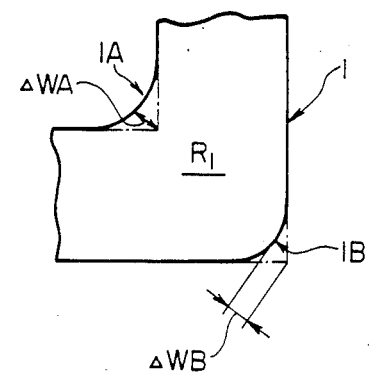
FIG. 1(b) is a plan view showing the corners of the resistor in FIG. 1(a) on an enlarged scale.

Here, let's consider the plane pattern shape of a thin-film resistor as shown in FIGS. 1(a) and 1(b).

As illustrated in the figures, the thin-film resistor R1 is formed in such a way that the thin-film layer of a metallic resistor 1 of aluminum or the like is etched into a zigzagged plane pattern shape. The thin-film resistors R1 thus formed are connected in large numbers, whereby a resistor ladder for use in, e.g., an A/D converter is constructed. In this case, the plane pattern shape of the thin-film resistor is put into the bent shape for the purpose of securing a large resistance value in a limited space.

The inventors' studies have revealed, however, the problem that the thin-film resistor inevitably involves corners 1A and 1B of sharp angle (approximately 90 degrees) on account of the bending formation and that the corners 1A and 1B degrade the precision of the resistor R1.

More specifically, the inventors' studies have revealed that as partly enlarged and shown in FIG. 1(b), the reproducibility of the shape of the corners 1A and 1B of the resistor 1 is limited by the precision of etching with photolithography, etc., so that effective resistor width W between the corners 1A and 1B change irregularly. This creates discrepancies in the resistance value of the resistor R1. In FIG. 1(b), $\Delta WA$ and $\Delta WB$ indicate the deviations of dimensions at the corners 1A and 1B. In particular, the inner corner 1A tends to undergo more concentration of current than the outer corner 1B. Therefore, the dimensional deviation $\Delta WA$ at the inner corner 1A forms a major cause for changing the resistance value of the resistor R1.

Accordingly, even when the ladder resistor is formed with the thin-film resistors R1 stated above, it has been very difficult to raise the relative precision among the individual resistors R1. For this reason, it has been difficult to attain a high resolution precision in a circuit whose precision depends upon the relative precision of a ladder resistor, for example, the parallel type A/D converter.

Embodiments

Now, typical embodiments of this invention will be described with reference to the drawings.

In the drawings, the same symbols indicate identical or corresponding portions.

Figure 2A:
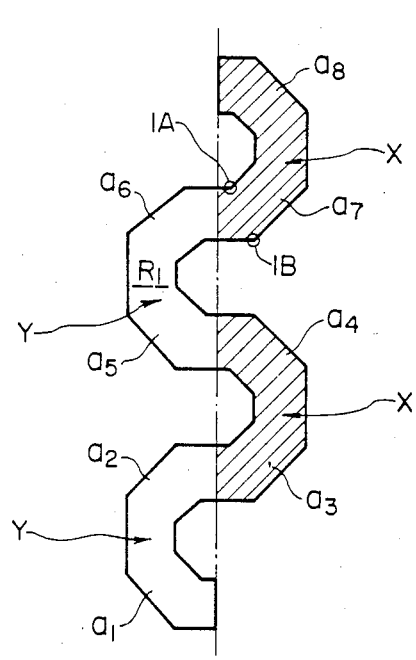
FIG. 2(a) shows the plane shape of a thin-film resistor according to the present invention.
Figure 2B:
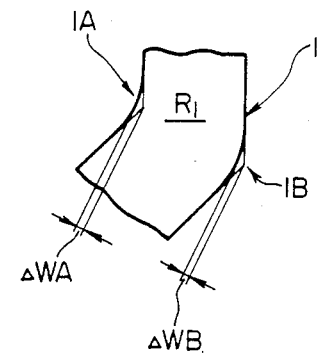
FIG. 2(b) is a plan view showing the corners of the resistor in FIG. 2(a) on an enlarged scale.

FIGS. 2(a) and 2(b) show an embodiment of a thin-film resistor according to this invention.

The thin-film resistor R1 shown in the figures is formed in such a way that a conductor layer of aluminum or the like is evaporated on the principal surface of an insulator film such as oxide film ($SiO_2$ film) which is provided on a semiconductor wafer in a semiconductor integrated circuit device (IC). The thin-film resistor R1 is then etched by the use of the photo-etching process. The plane pattern shape of the thin-film resistor is bent zigzag in order to attain a large resistance value. Also, the corners 1A and 1B of the pattern are respectively formed at an obtuse angle (approximately 135 degrees).

Since the corners 1A and 1B are respectively formed at the obtuse angle in this manner, deformation ascribable to the etching is much less apt to occur in the widthwise direction, and dimensional deviations in the widthwise direction, $\Delta WA$ and $\Delta WB$ at the inner corner 1A and the outer corner 1B can be kept respectively small, as partially enlarged and illustrated in FIG. 2(b). As a result, the deviation of a resistance value decreases, and, especially in the case of connecting a large number of such resistors into the ladder type, a high relative precision can be attained.

Figure 3:
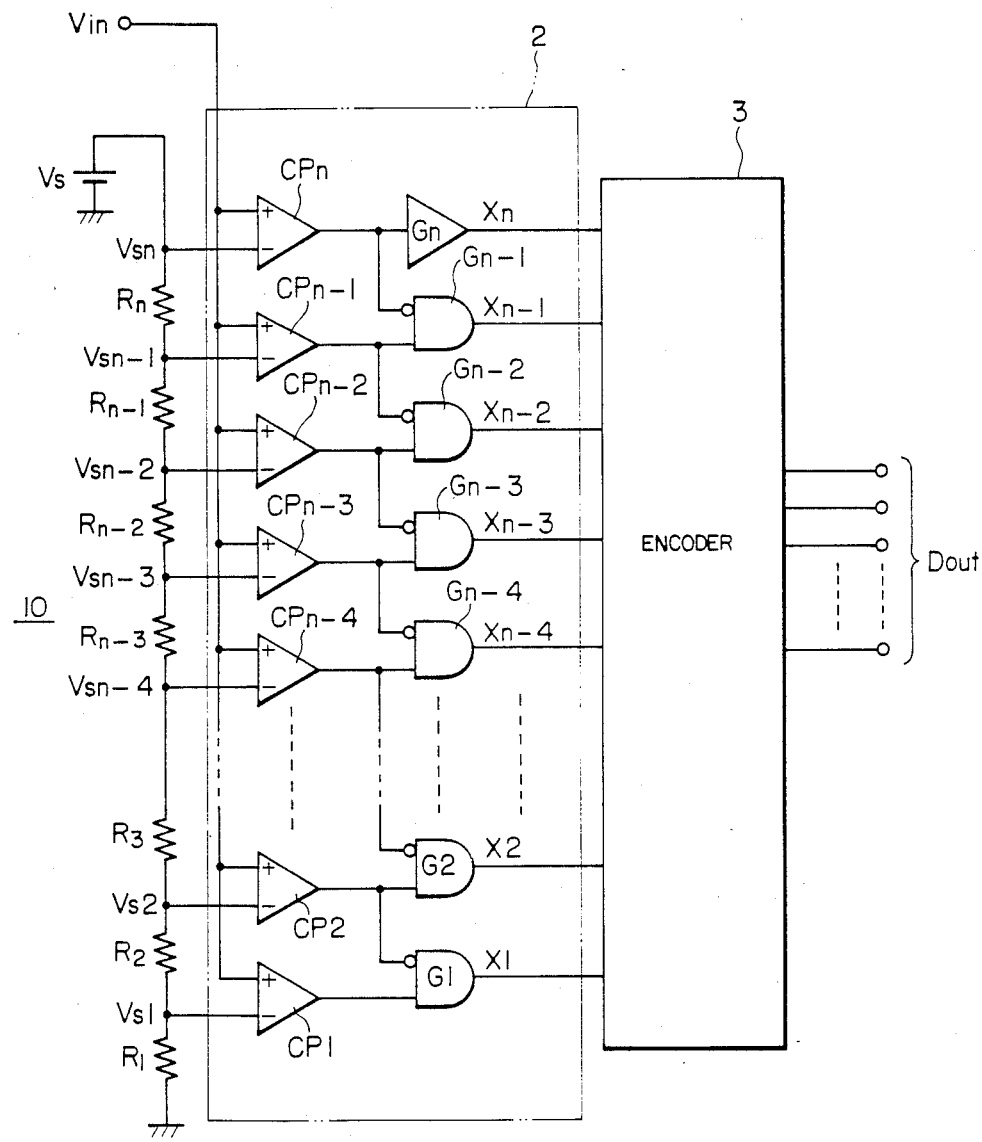
FIG. 3 is a circuit diagram showing the circuit arrangement of an A/D converter.

FIG. 3 shows an embodiment of a parallel type A/D converter to which this invention is applied.

As shown in the figure, the parallel type A/D converter is such that a common analog input voltage $V_{in}$ is applied to one input (+) of each of a large number of voltage comparators $CP_1$-$CP_n$, while reference voltages $V_{s1}$-$V_{sn}$ differing stepwise are respectively applied to the other inputs (−) of the large number of voltage comparators $CP_1$-$CP_n$. A digital output $D_{out}$ corresponding to the input voltage $V_{in}$ is derived from the comparison output sides of the voltage comparators $CP_1$-$CP_n$. In this case, the comparison outputs of the comparators $CP_1$-$CP_n$ are respectively provided in terms of the logic levels "1" and "0", and they are converted into alternative selection signals $X_1$-$X_n$ by logical product gates $G_1$-$G_n$ which are disposed in correspondence with the respective comparators $CP_1$-$CP_n$. The selection signals $X_1$-$X_n$ are assembled into a binary code train of a predetermined number of digits by an encoder 3. The assembled code train becomes the digital output $D_{out}$.

Here, the respective reference voltages $V_{s1}$-$V_{sn}$ are obtained in such a way that the voltage of a reference voltage souce $V_s$ is divided at equal intervals by a ladder resistor 10. The ladder resistor 10 is constructed in such a way that a large number of resistors $R_1$-$R_n$ having equal values to one another are connected in series.

The voltage comparators $CP_1$-$CP_n$ compare the respective reference voltages $V_{s1}$-$V_{sn}$ divided by the ladder resistor 10 and the analog input voltage $V_{in}$ applied in common.

Assuming now that the input voltage $V_{in}$ has a value within the relationship of $V_{sn-2} < V_{in} < V_{sn-1}$, the output of the logical product (AND) gate $G_{n-2}$ becomes the "H" level, and all the outputs of the other AND gates ($G_1$-$G_{n-3}$, $G_{n-1}$ and $G_n$) become the "L" level. Owing to the "H" level of the output of the AND gate $G_{n-2}$, it is decided that the input voltage is in the aforementioned relationship. The encoder 3 converts the decided result into the digital signal ($D_{out}$) of desired bits. Then, an A/D conversion operation is completed.

The parallel type A/D converter of this sort can attain a very high conversion speed as compared with a follow-up type A/D converter. It is therefore suited to digitize high-speed analog signals, for example, video signals. This parallel type A/D converter, however, requires the ladder resistor 10 of high relative precision in order to produce the reference voltages $V_{s1}$-$V_{sn}$. When the relative precision of the ladder resistor 10 is low, the resolution and linearity of a conversion characteristic are spoilt, and the so-called conversion error occurs. In an A/D converter to be described below, thereof, the ladder resistor 10 is constructed in such a way that thin-film resistors $R_1$-$R_n$ each having a plane pattern shape including a plurality of turn parts are connected in large numbers, and the relative precision among the individual resistors $R_1$-$R_n$ is raised in such a way that the corners of the pattern in the thin-film resistors $R_1$-$R_n$ are formed at an obtuse angle, whereby A/D conversion of high speed and high precision is permitted.

Figure 4:
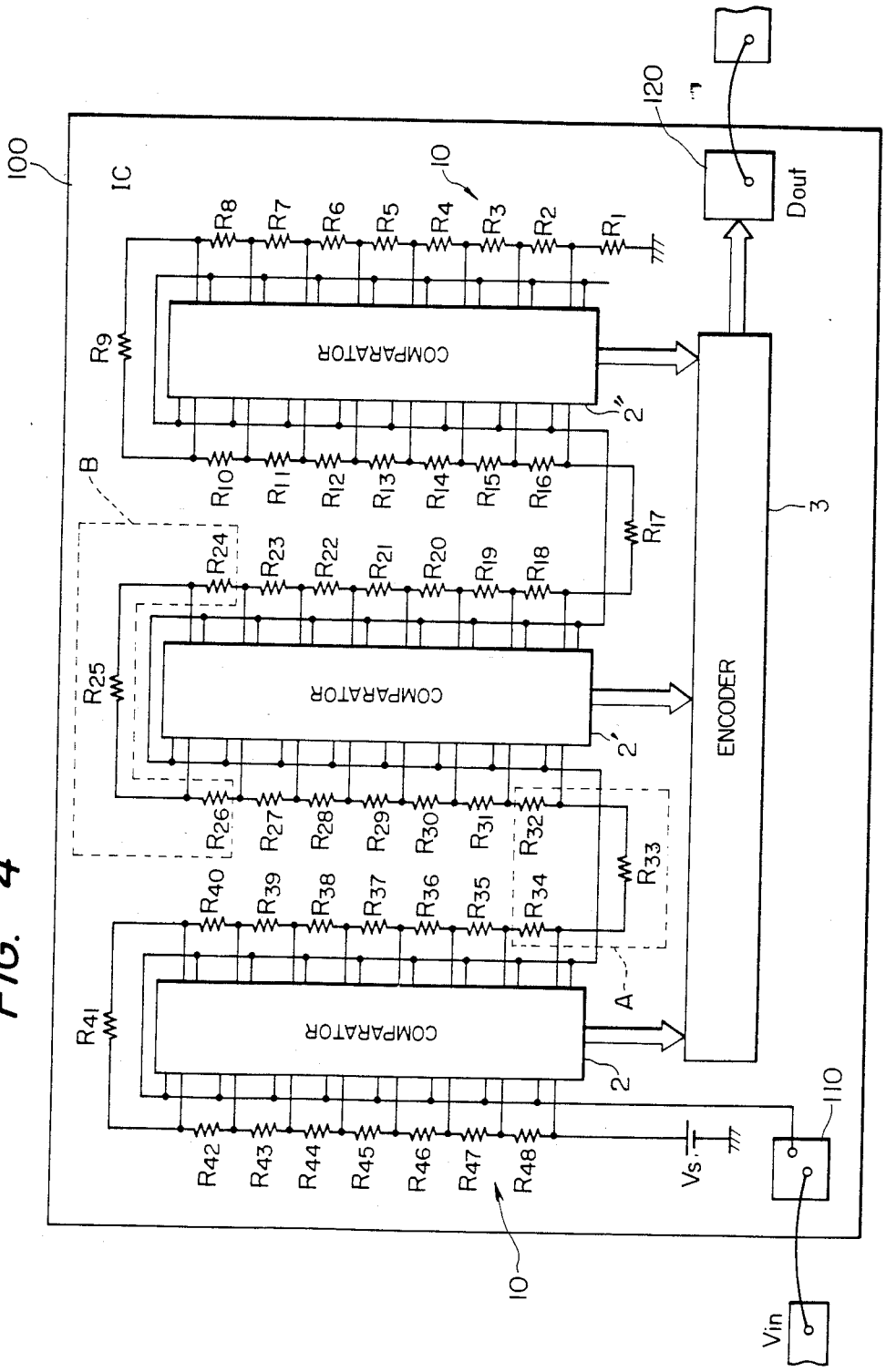
FIG. 4 is a plan view for explaining the state of plane layout in a semiconductor integrated circuit in which the A/D converter shown in FIG. 3 is implemented.

First, FIG. 4 shows the circuit of the A/D converter shown in FIG. 3, considering also a plane arrangement state in a silicon chip 100 in the IC implementation thereof. The A/D converter shown in the figure is similar circuit-wise to that shown in FIG. 3, and it is formed with a ladder resistor 10 as well as comparator circuit columns 2 which are divided and formed in a plurality of blocks. In each comparator circuit column 2, the large number of pairs of voltage comparators and logic gates shown in FIG. 3 are arrayed. The ladder resistor 10 is formed while being folded back between and around the comparator circuit blocks 2, 2' and 2". One end of the ladder resistor 10 is connected to the reference voltage source $V_s$, while the other end thereof is connected to the ground potential. The input voltage $V_{in}$ is applied through an input pad 110. Logic outputs from the respective comparator circuit blocks are subjected to preliminary encoding based on wired logic, and are thereafter input to the encoder 3. The digital output $D_{out}$ of the binary code train is delivered from the encoder 3 through an output pad 120.

Figure 5:
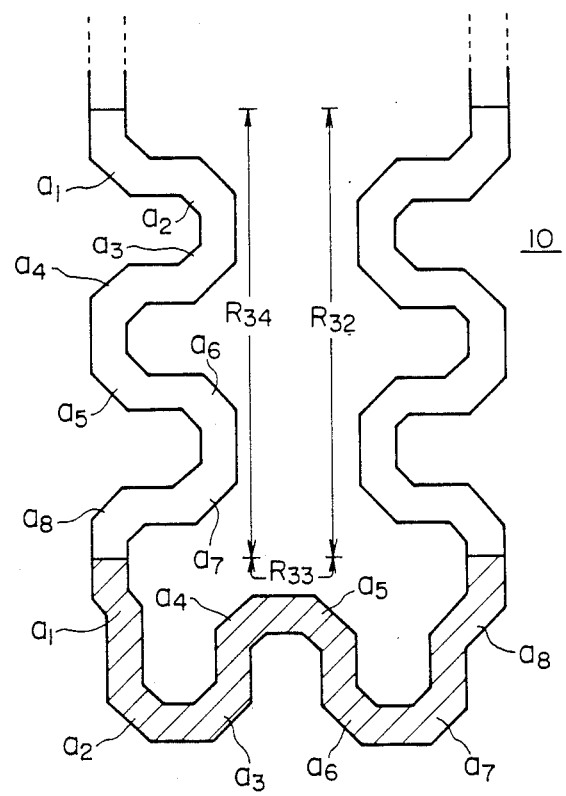
FIG. 5 is a plan view showing the shape of a thin-film resistor portion indicated at A in FIG. 4.

Here, the ladder resistor 10 has a non-folded-back portion (rectilinear portion) which extends along the side part of the comparator circuit block 2 (2', 2"), a small round portion (a portion A enclosed with a dotted line in FIG. 4) which is folded back to back, and a large round portion (a portion B enclosed with a dotted line in FIG. 4) which strides over the end part of the comparator circuit block 2 (2', 2"). In the non-folded-back portion, the thin-film resistors $R_1$-$R_n$ shown in FIG. 2(a) are connected in series in large numbers. Besides, in the small round portion A, a thin-film resistor $R_{33}$ of a plane pattern shape indicated with hatching in FIG. 5 is arranged. Further, in the large round portion B, a thin-film resistor $R_{25}$ of a plane pattern shape indicated with hatching as shown in FIG. 6 is arranged.

Likewise to the thin-film resistor $R_{34}$ or $R_{32}$ in the rectilinear portion, the thin-film resistor $R_{33}$ shown in FIG. 5 has the plane pattern shape including a plurality of turn parts and has the corners of the pattern formed at an obtuse angle. The thin-film resistor $R_{33}$ in the small round portion A is a resistor which connects the thin-film resistors $R_{34}$ and $R_{32}$ of the two rectilinear portions to each other. Normally, a disorder of the relative precision of the ladder resistor is quite likely to occur here. However, the widths and lengths of the resistors are equalized, so that the resistors $R_{32}$, $R_{33}$ and $R_{34}$ have resistance values equal to one another. Further, although the thin-film resistor $R_{34}$ or $R_{32}$ of the non-folded-back portion and the thin-film resistor $R_{33}$ of the small round portion differ in the bending direction partly, the numbers and flexional angles of the turn parts $a_1$-$a_8$ of these resistors are equalized to each other. Thus, even when some errors have developed in the precision of photoetching, for example, the positioning of a mask or the etching of the turn parts, the fluctuations of the resistance values attributed to the errors appear similarly in the thin-film resistor $R_{32}$ or $R_{34}$ of the non-folded-back portion and the thin-film resistor $R_{33}$ of the small round portion A. Accordingly, the thin-film resistor $R_{33}$ of the small round portion has its absolute error suppressed to a small value and can also have a very high relative precision to the thin-film resistor $R_{32}$ or $R_{34}$ of the non-folded-back portion.

Figure 6:
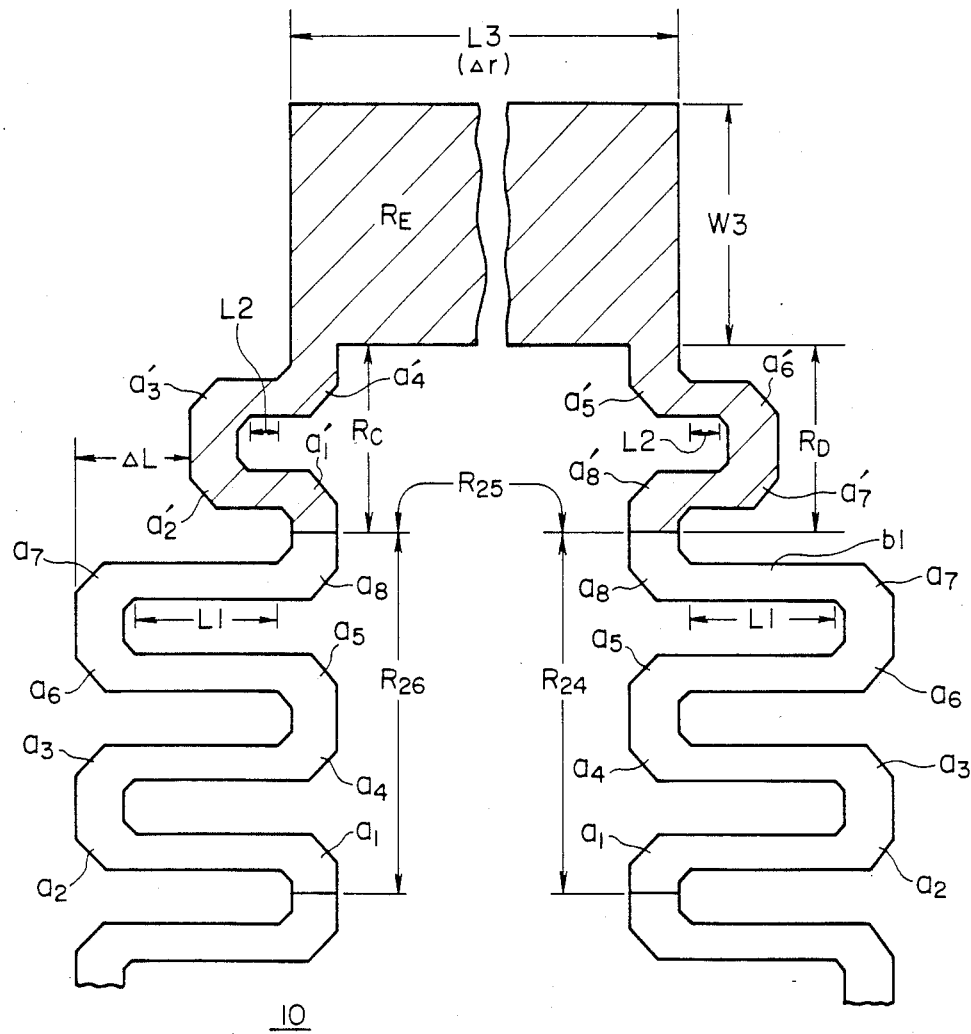
FIG. 6 is a plan view showing an example of a shape of a thin-film resistor portion indicated at B in FIG. 4.

FIG. 6 shows the plane pattern shape of the thin-film resistor $R_{25}$ which is formed in the portion B enclosed with the dotted line in FIG. 4, namely, the large round folded-back portion.

As illustrated in FIG. 6, the thin-film resistor $R_{25}$ formed in the large round folded-back portion has turn parts $a_1'$-$a_8'$ which are identical in shape to the turn parts $a_1$-$a_8$ in a thin-film resistor $R_{24}$ or $R_{26}$ in the non-folded-back portion. In addition, the size of the plane shape is adjusted so that the resistance value of the resistor $R_{25}$ may be equalized to the resistance value of the resistor $R_{24}$ or $R_{26}$.

In this case, the thin-film resistor $R_{25}$ of the folded-back portion is formed by resistor portions $R_C$ and $R_D$ which have the turn parts identical in shape to those of the thin-film resistor $R_{24}$ or $R_{26}$ of the non-folded-back portion, and a broad oblong resistor $R_E$ which is formed for interconnecting the resistor portions $R_C$ and $R_D$.

The portions $R_C$ and $R_D$ are formed with the plurality of turn parts likewise to the thin-film resistor $R_{24}$ or $R_{26}$ in the non-folded-back portion, and the plane shape of the turn parts $a_1'$-$a_8'$ is identical to that of the turn parts $a_1$-$a_8$ of the resistor $R_{24}$ or $R_{26}$. On the other hand, the portion $R_E$ has its length $L_3$ determined to a magnitude necessary for striding over the end part of the comparator circuit (FIG. 4). Also, it has its width $W_3$ set to a large value so that its resistance value $\Delta r$ may become sufficiently small.

Although the resistor $R_{24}$ or $R_{26}$ and the resistor $R_{25}$ differ in the plane shape and dimensions partly, they are identical in the shape of the turn parts ($a_1$-$a_8$, $a_1'$-$a_8'$) to each other. Therefore, even when some errors have developed in the process of photoetching, for example, the positioning of a mask, the changes of the resistance values attributed to the errors appear similarly in both the thin-film resistor $R_{24}$ or $R_{26}$ of the non-folded-back portion and the resistor $R_{25}$ of the large round folded-back portion. Accordingly, the thin-film resistor $R_{25}$ of the large round folded-back portion can have a very high relative precision to the thin-film resistor $R_{24}$ or $R_{26}$ of the non-folded-back portion even when a trimming correction is not made.

Figure 7:
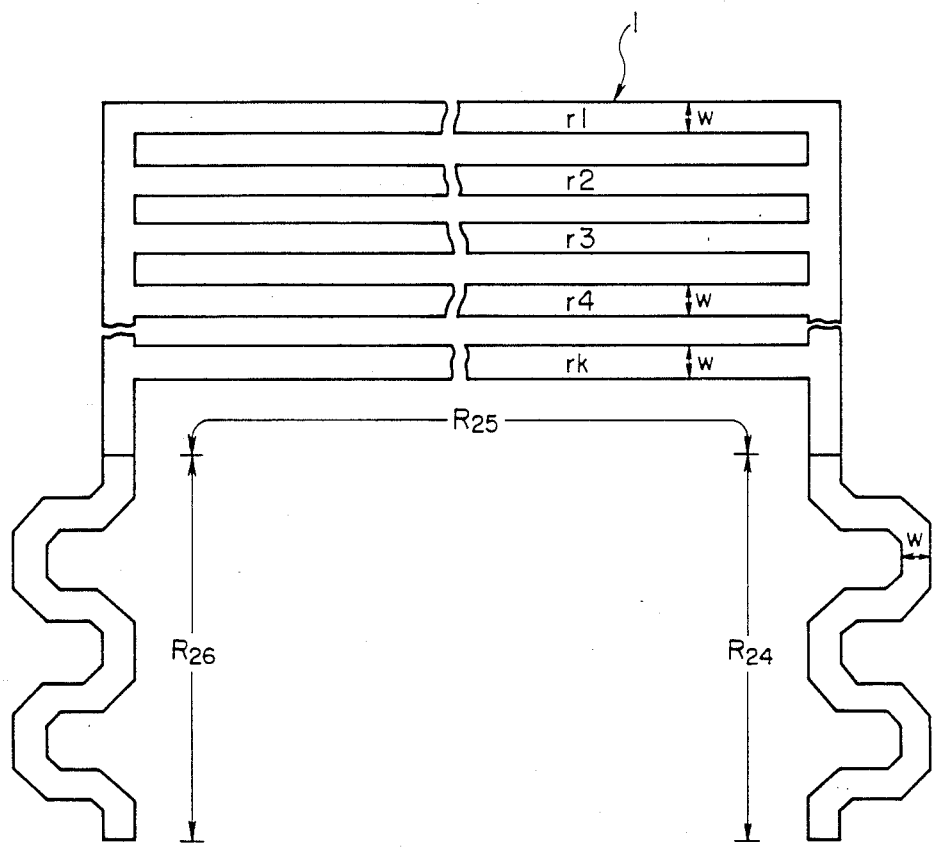
FIG. 7 is a plan view showing another example of the shape of the thin-film resistor portion indicated at B in FIG. 4.

FIG. 7 shows another example of the large round portion. This thin-film resistor $R_{25}$ is composed of a large number of rectilinear thin-film resistor pattern portions $r_1$-$r_k$. The respective thin-film resistor pattern portions $r_1$-$r_k$ are connected in parallel to one another, and they are formed so that the combined parallel resistance thereof may equalize to the resistance value of the thin-film resistor $R_{24}$ or $R_{26}$. In addition, the width W of each of the parallel resistors is equalized to the width W of the resistor in the rectilinear portion. When the large number of thin-film resistor pattern portions $r_1$-$r_k$ are connected in parallel in this manner, the extent of the deviations of resistance values which occur in the parallel resistors $r_1$-$r_k$ becomes equal to the extent of the deviations which occur in the resistors $R_{24}$ and $R_{26}$ in the rectilinear portions. Further, a resistance error which develops in each of the resistor pattern portions $r_1$-$r_k$ is diminished in accordance with the number of the pattern portions connected in parallel. Accordingly, the precision of this thin-film resistor $R_{25}$ of the large round portion can also be rendered high.

Figure 8:
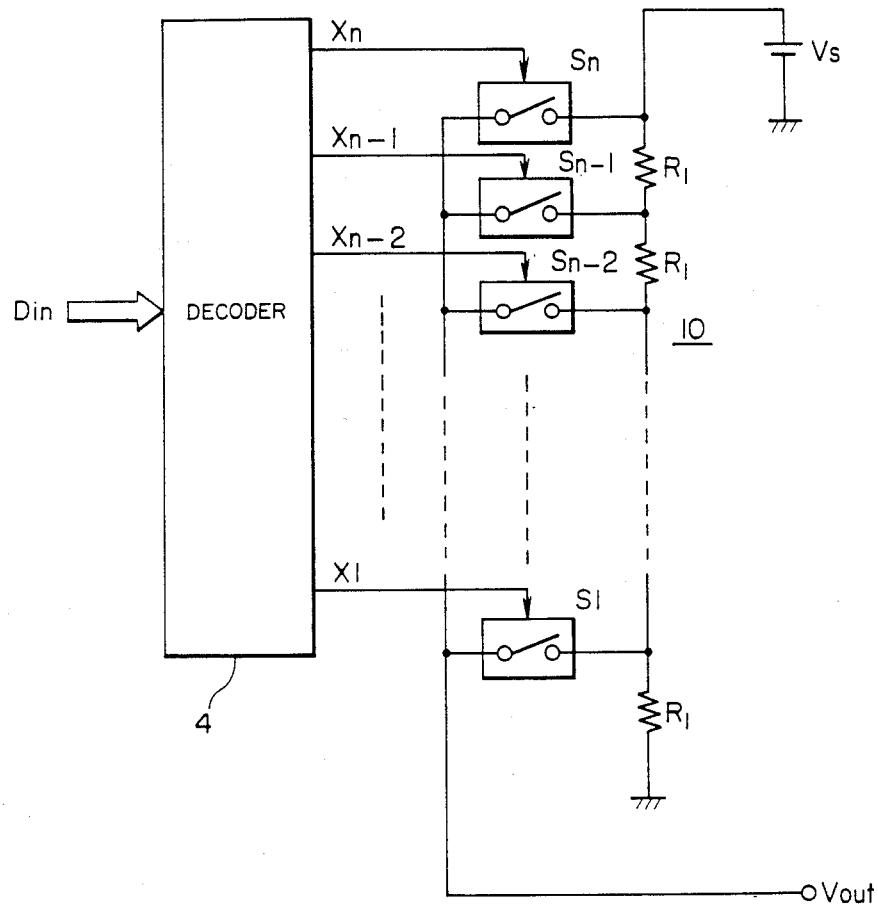
FIG. 8 is a circuit diagram showing the circuit arrangement of a D/A converter.

FIG. 8 shows an embodiment of a D/A converter to which this invention is applied.

The D/A converter shown in the figure has a decoder 4 which converts a digital input $D_{in}$ into an alternative selection signal $X_1$-$X_n$, analog switches $S_1$-$S_n$ which are individually controlled 'on' and 'off' by the selection signals $X_1$-$X_n$, and a resistor ladder 10 which equally divides the voltage of a reference voltage source $V_s$ so as to apply the divided voltage to one end of each of the analog switches $S_1$-$S_n$. The other ends of the respective analog switches $S_1$-$S_n$ are connected in common, and an analog voltage $V_{out}$ corresponding to the digital input $D_{in}$ is output from the common connection point. Here, the ladder resistor 10 is constructed by the use of the thin-film resistors described before, including, if desired, a folded-back arrangement such as shown in FIG. 4. Thus, the D/A converter whose conversion characteristic has a very high linearity precision can be provided.

The effects of the present invention thus far described are summed up below.

(1) The corners of a thin-film resistor in a plane pattern shape having a plurality of turn parts are formed at an obtuse angle. This produces the effect that the precision of the resistor can be raised.

(2) The thin-film resistor is bent alternately bilaterally with respect to a phantom center line, whereby the deviation of a resistance value can be cancelled in the right and left parts of the resistor.

(3) In a ladder resistor in which the thin-film resistors are connected in large numbers, the corners of a pattern in each thin-film resistor are formed at the obtuse angle, and the numbers and flexional angles of the turn parts of the patterns in the respective thin-film resistors are equalized to one another. Thus, even when some errors have developed in the precision of etching, for example, the positioning of a mask, the fluctuations of resistance values ascribable to the errors arise similarly. This produces the effect that a high relative precision can be achieved among the resistors.

(4) In a ladder resistor which is folded back and formed, a thin-film resistor in a folded-back portion and a thin-film resistor in a non-folded-back portion are so formed that the plane shapes of turn parts in the respective portions are identical to each other. This produces the effect that, with the simple construction of merely altering the pattern shapes of the thin-film resistors, the relative precision between the thin-film resistor in the folded-back portion of the ladder resistor folded back and formed and the thin-film resistor in the non-folded-back portion can be raised reproducibly.

(5) Accordingly, the use of the ladder resistor can bring forth the effect that a parallel type A/D converter or D/A converter excellent in resolution and linearity can be provided.

The present invention can be modified in various ways without departing from the scope of the present invention. For example, the resistance values of the respective thin-film resistors $R_1$, $R_2$, ... constituting the ladder resistor 10 may well be weighted. The shape of the turn parts may well be curved. While, in the above, the invention made by the inventors has been chiefly described as to the application to the parallel tuype A/D conversion technology which is the background field of utilization, the invention is not restricted thereto. On the contrary, it is also applicable to, for example, attenuator or regulated current circuit technology. In fact, the invention is applicable to any device which requires resistors of high relative precision.

It is to be understood that the above-described arrangements are simply illustrative of the application of the principles of this invention. Numerous other arrangements may be readily devised by those skilled in the art which embody the principles of the invention and fall within its spirit and scope.

We claim:

1. An analog-to digital converter comprising:
   a plurality of voltage comparators each of which has two input terminals;
   first means for applying a common analog input voltage to comparators;
   second means for respectively applying reference voltages differing stepwise to the other input terminals of said plurality of voltage comparators for obtaining a digital output from the comparators corresponding to the input voltage to said comparators;
   and wherein said second means comprises a ladder resistor formed of a plurality of resistors connected in series, wherein each resistor is a thin film resistor formed zigzag such that its contour essentially consists of a plurality of obtuse angle bending portions defined by respective adjacent turn parts of the resistor, such that two lines colinear with each of two contiguous edges of said thin film resistor define an obtuse angle, and wherein each of said resistors comprises:
   a first reversely bent portion which includes a plurality of obtuse angle bending portions defined by respective adjacent turn parts of said first reversely bent portion; and
   a second reversely bent portion which joins to a terminal end of said first bent portion and which is formed of a plurality of said turn parts of said second reversely bent portion,
   wherein said first reversely bent portion is so shaped as to have the plurality of turn parts thereof on one side of a plane bisected with a phantom center line as a boundary, said first reversely bent portion extending from one portion of the phantom center line back to another portion of the phantom center line,
   wherein said second reversely bent portion is so shaped as to have the plurality of turn parts thereof on the other side of the plane bisected with the phantom center line as the boundary, said second reversely bent portion extending from one portion of the phantom center line back to another portion of the phantom center line, and
   further wherein the number and the angles of the obtuse angle bending portions of said turn parts in said first reversely bent portion are equal to those in said second reversely bent portion, whereby a digital output corresponding to the input voltage is derived from the outputs of said voltage comparators.

2. An analog-to-digital converter according to claim 1, wherein said ladder resistor further comprises:
   a first portion of said ladder resistor which extends in a predetermined direction; and
   a second portion of said ladder resistor which joins to a terminal end of said first portion and which is folded back at a predetermined angle to the predetermined direction.

3. An analog-to-digital converter according to claim 2, wherein said first portion is constructed by connecting a plurality of said resistors in series, wherein said second portion is constructed of at least one resistor, and wherein said at least one resistor constituting said second portion is equal in the number of said turn parts and the angles of said obtuse angle bending portions to resistors constituting said first portion.

4. An analog-to-digital converter according to claim 2, wherein said second portion is constructed of a plurality of rectilinear conductor films which are connected in parallel, and a combined resistance value of which is approximate to a resistance value of a single resistor of said first portion.

5. An analog-to-digital converter according to claim 1, wherein a polygon defined by said first reversely bent portion and the phantom center line is congruent or similar to a polygon defined by said second reversely bent portion and the phantom center line.

6. A monolithic semiconductor integrated circuit A/D converter device of a parallel-comparator type comprising:
   (a) a substrate member at a first major surface of which the integrated circuit is formed;
   (b) an insulating film formed on the first major surface;
   (c) a thin film resistor formed on the insulating film, which is bent zigzag in order to attain a large resistance value, and has a large number of terminals for providing a large number of discrete reference voltages; and
   (d) a large number of comparator circuit, each of which compares an input voltage with one of the reference voltages, the outputs of said comparator circuits being used to produce a digital output of said converter device;
   the thin film resistor being formed in a plane pattern shape such that its contour essentially consists of obtuse angle bending portions such that two lines colinear with each of the two contiguous edges of said thin film resistor define an obtuse angle to such extent that lithographical errors in patterning it don't have substantial adverse effects on its resistance value, whereby A/D conversion of high speed and high precision is permitted.

7. A monolithic semiconductor integrated circuit according to claim 6, wherein the thin film resistor is a large number of resistors connected in series having equal values to one another.

8. A monolithic semiconductor integrated circuit according to claim 7, wherein the thin film resistor is made of a metal film deposited on the insulating film.

9. A monolithic semiconductor integrated circuit according to claim 8, wherein the metal film consists essentially of aluminum.

10. A monolithic semiconductor integrated circuit according to claim 6, wherein the thin film resistor is made of a metal film deposited on the insulating film.

11. A monolithic semiconductor integrator circuit according to claim 10, wherein the metal film consists essentially of aluminum.

12. A digital-to-analog converter comprising:
    a decoder circuit which delivers a set of digital signals corresponding to an input digital signal to respective ones of a plurality of switch means;
    said plurality of switch means being controlled by the outputs of said decoder circuit for selectively supplying an output terminal of said converter with a plurality of voltages of different values derived from a voltage supply via a ladder resistor formed of a plurality of resistors connected in series, wherein each resistor is a thin film resistor which has a zigzag configuration such that its contour essentially consists of obtuse angle bending portions defined by adjacent turn parts of said resistor, such that two lines colinear with each of two contiguous edges of said thin film resistor define an obtuse angle, and wherein each of said resistors comprises:
    a first reversely bent portion having a plurality of said obtuse angle bending portions defined by said turn parts; and
    a second reversely bent portion which joins to a terminal end of said first reversely bent portion and which has a plurality of said obtuse angle bending portions defined by turn parts,
    wherein said first reversely bent portion is so shaped as to have the plurality of turn parts thereof on one side of a plane bisected with a phantom center line as a boundary, said first reversely bent portion extending from one portion of the phantom center line back to another portion of the phantom center line,
    wherein said second reversely bent portion is so shaped as to have the plurality of turn parts thereof on the other side of the plane bisected with the phantom center line as the boundary, said second reversely bent portion extending from one portion of the phantom center line back to another portion of the phantom center line, and
    further wherein the number and the angles of said obtuse angle bending portions of said turn parts in said first reversely bent portion are equal to those in said second reversely bent portion.

13. A digital-to-analog converter according to claim 12, wherein a polygon defined by said first reversely bent portion and the phantom center line is congruent or similar to a polygon defined by said second reversely bent portion and the phantom center line.

14. A digital-to-analog converter according to claim 12, wherein said ladder resistor further comprises:
    a first portion of said ladder resistor which extends in a predetermined direction; and
    a second portion of said ladder resistor which joins to a terminal end of said first portion and which is folded back at a predetermined angle to the predetermined direction.

15. A digital-to-analog converter according to claim 14, wherein said first portion is constructed by connecting a plurality of said resistors in series, wherein said second portion is constructed of at least one resistor, and wherein said at least one resistor constituting said second portion is equal in the number of said turn parts and the angles of said obtuse angle bending portions thereof to resistors constituting said first portion.

16. A digital-to-analog converter according to claim 14, wherein said second portion is constructed of a plurality of rectilinear conductor films which are connected in parallel, and a combined resistance value of which is approximate to a resistance value of a single resistor of said first portion.

* * * * *